United States Patent
Ishimaru

Patent Number: 5,681,418
Date of Patent: Oct. 28, 1997

[54] PLASMA PROCESSING WITH INDUCTIVE COUPLING

[75] Inventor: Yasushi Ishimaru, Kawasaki, Japan

[73] Assignee: Fujitsu Limited, Kawasaki, Japan

[21] Appl. No.: 521,440

[22] Filed: Aug. 30, 1995

[30] Foreign Application Priority Data

Dec. 6, 1994 [JP] Japan .................... 6-302373

[51] Int. Cl.$^6$ .................... C23C 15/00
[52] U.S. Cl. .................... 156/345; 118/723 IR; 315/111.51
[58] Field of Search .................... 156/345, 643.1; 118/723 I, 723 IR; 315/111.51; 216/68

[56] References Cited

U.S. PATENT DOCUMENTS

| | | | |
|---|---|---|---|
| 4,795,879 | 1/1989 | Hull et al. | 315/111.51 |
| 4,844,775 | 7/1989 | Keeble | 156/643.1 |
| 5,087,434 | 2/1992 | Frenklach et al. | 423/446 |
| 5,234,529 | 8/1993 | Johnson | 156/345 |
| 5,241,245 | 8/1993 | Barnes et al. | 156/643.1 |
| 5,304,282 | 4/1994 | Flamm | 156/643.1 |
| 5,346,578 | 9/1994 | Benzing et al. | 156/345 |
| 5,514,246 | 5/1996 | Blalock | 156/643.1 |

FOREIGN PATENT DOCUMENTS

| | | |
|---|---|---|
| 62-040376 | 2/1987 | Japan . |
| 01211921 | 8/1989 | Japan . |
| 05242995 | 9/1993 | Japan . |

Primary Examiner—R. Bruce Breneman
Assistant Examiner—George Goudreau
Attorney, Agent, or Firm—Armstrong, Westerman, Hattori, McLeland & Naughton

[57] ABSTRACT

A plasma processing apparatus includes: a process chamber with a side wall capable of being evacuated; magnetic field generating means disposed externally of the side wall of the process chamber, for generating a radio frequency magnetic field in the process chamber and generating plasma through inductive coupling; a base disposed in the process chamber for placing thereon a substrate to be processed; and a cooling unit for cooling the side wall of the process chamber near at a space where the plasma is generated. It is possible to generate high density plasma under a low pressure and to prevent the inner surface of a vacuum belljar from being etched by plasma.

18 Claims, 4 Drawing Sheets

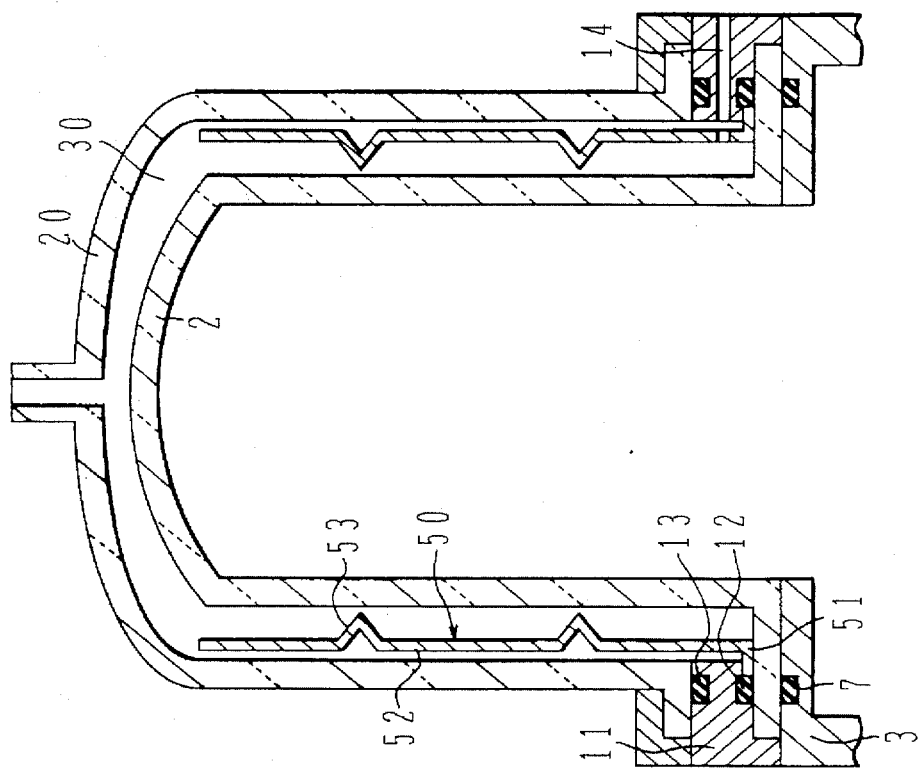
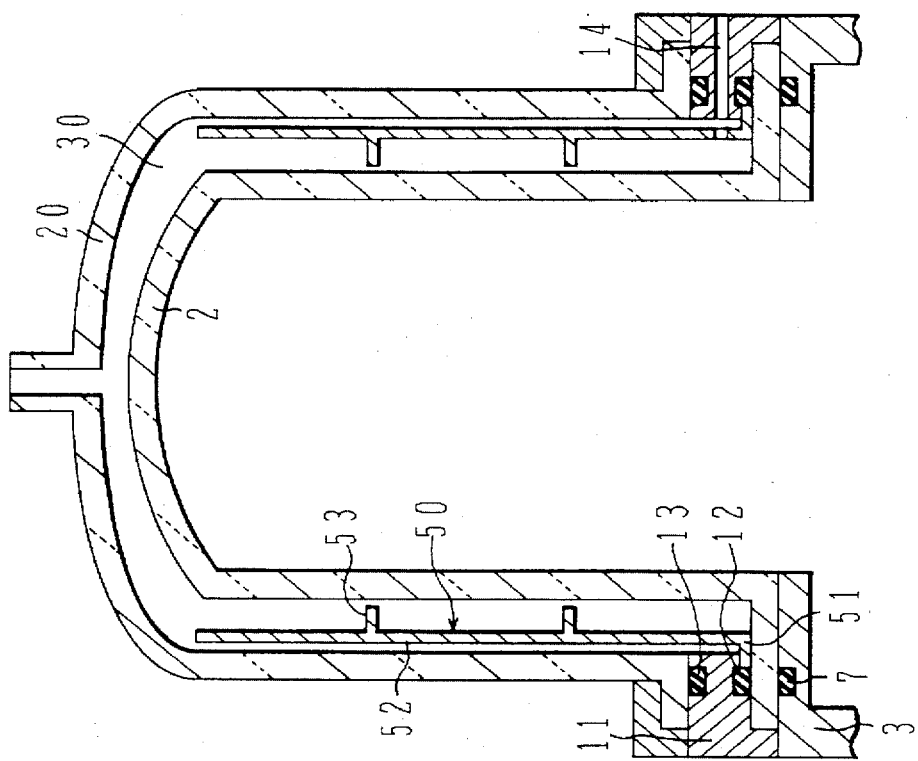

PLASMA PROCESSING WITH INDUCTIVE COUPLING

BACKGROUND OF THE INVENTION a) Field of the Invention

The present invention relates to a plasma processing system, and more particularly to a plasma processing system for generating plasma through inductive coupling and processing the surface of a substrate by using the energy of plasma.

b) Description of the Related Art

As semiconductor integrated circuit devices are becoming highly integrated, the wiring widths of circuits are becoming narrower and the wiring density per unit area is becoming higher. In plasma-etching a substrate surface covered with a resist pattern, if a wiring width is relatively broad, the space between wiring patterns is also large. Therefore, charged and neutral particles obliquely incident upon an opening of a resist pattern can collide with the substrate surface exposed at the bottom of the opening.

However, if a wiring width is narrow, the space between wiring patterns is also small. Charged and neutral particles obliquely incident upon an opening collide with the side wall of the opening and don't reach the substrate surface, with a large probability. As the space becomes small, the microloading effect becomes more significant and lowers an etching rate, as compared to the case with a large space.

In order to suppress the influence of the microloading effects, it is sufficient if the number of charged and neutral particles obliquely incident is reduced. To this end, it is effective to lower an atmospheric pressure during etching.

From this viewpoint, attention has been paid to plasma processing through inductive coupling which can generate stable plasma even under a low pressure.

A conventional plasma processing system of an inductive coupling type will be described with reference to FIG. 4.

FIG. 4 is a cross sectional view showing the outline of an inductive coupling type plasma processing system.

A chamber 100 and a vacuum belljar 101 define a process space capable of being evacuated. A radio frequency (RF) coil 102 is wound round the vacuum belljar 101. An RF power source 104 supplies RF current to the RF coil 102 via a matching circuit 103.

Formed in the side wall of the chamber 100 are a process gas supply hole 106 for supplying process gas into the process space and a process gas exhaust hole 107 for evacuating the process space.

On the bottom of the chamber 100, a base 109 is mounted. A substrate 100 is placed on the upper surface of the base 109 during plasma processing. The base 109 is applied with RF voltage from another RF power source 111 via another matching circuit 110.

As process gas is introduced via the gas supply hole 106 into the process space and RF current is flowed through the RF coil 102, an RF magnetic field is generated in the space of the vacuum belljar 101 and a plasma 105 is generated through inductive coupling.

Ions in the plasma receive a force which moves them toward the surface of the substrate 108, because of the RF voltage applied to the base 109. Ions transported near to the surface of the substrate 108 and radicals changed from ions to neutral state during transportation, react with the substrate surface.

With the conventional plasma processing system shown in FIG. 4, ions and radicals in the plasma generated in the space near the coil 102 sputter the inner surface of the side wall of the vacuum belljar 101. If process gas capable of chemically reacting with the material of the vacuum belljar is used, the inner surface of the side wall of the vacuum belljar 101 is etched.

As the inner surface of the side wall of the vacuum belljar 101 is sputtered or etched, impurities contained in the material of the belljar or gas generated from the belljar are mixed with the plasma. Impurities mixed with the plasma adversely affect the surface of the substrate 108.

In order to ensure the performance of a vacuum belljar and to prevent the generation of impurities, periodical replacement of belljars is required which results in high running cost.

SUMMARY OF THE INVENTION

It is an object of the present invention to provide a plasma processing system capable of suppressing sputtering and/or etching of the inner surface of the side wall of a vacuum belljar.

According to one aspect of the present invention, there is provided a plasma processing system including: a process chamber with a side wall capable of being evacuated; magnetic field generating means disposed externally of the side wall of the process chamber, for generating a radio frequency magnetic field in the process chamber and generating plasma through inductive coupling; a base disposed in the process chamber for placing thereon a substrate to be processed; and a cooling unit for cooling the side wall of said process chamber near at a space where the plasma is generated.

The cooling unit may comprise: a double wall structure having the side wall of the process chamber serving as an inner wall and an outer wall for defining a hermetically sealed gap between the inner wall and the outer wall; coolant supply means for supplying coolant into the gap; and coolant exhaust means for exhausting the coolant from the gap.

The cooling unit can cool the side wall of the process chamber near the space where plasma is generated. As the side wall of the process chamber is cooled, chemical reaction between the inner surface of the side wall and ions and the like in the plasma can be suppressed. Accordingly, the inner surface of the side wall becomes hard to be etched.

The magnetic field generating means may generate the radio frequency magnetic field and a radio frequency electric field. In such a case, the plasma processing system may further comprise a conductive shielding plate disposed in the gap for shielding the radio frequency electric field.

Since the shielding plate shields the radio frequency electric field generated by the magnetic field generating means, the radio frequency electric field becomes hard to reach near the inner surface of the side wall of the process chamber. Because the radio frequency electric field is intercepted, ions and charged particles in the plasma become hard to be attracted near to the inner surface of the side wall of the process chamber. Accordingly, the inner surface of the side wall of the process chamber becomes hard to be sputtered.

The inner surface of the side wall of the process chamber becomes hard to be etched or sputtered by the above functions. Therefore, replacement occurrence frequency of etched or sputtered parts can be reduced. It is therefore expected that a running cost of the plasma processing system is lowered. Furthermore, it is possible to prevent impurities or the like contained in the side wall of the process chamber from being mixed into plasma. Since impurities in the plasma can be reduced, the reliability and yield of semiconductor devices are prevented from being lowered by such impurities.

The inner wall and the outer wall of the double wall structure each may have a tubular shape portion whose center axis is set generally in the vertical direction, and jointly define a guide passage in the gap defined by the double wall structure, the guide passage spirally transporting the coolant along the tubular shape portion; the coolant supply means may supply the coolant from a lower portion of a guide passage; the coolant exhaust means may exhaust the coolant from an upper portion of the guide passage.

A projection may be formed on the shielding plate on the side of the inner wall of the double wall structure, the projection reaching near the outer surface of the inner wall; the outer surface of the inner wall of the double wall structure and the shielding plate may define the horizontal position of said guide passage; and the projection formed on the shielding plate may define the vertical position of the guide passage.

The shielding plate is preferably formed with a plurality of slits generally in parallel with the direction of the radio frequency magnetic field.

When the shielding plate is disposed in the gap defined by the double wall structure for flowing coolant, the space can be efficiently utilized and the distance between the magnetic field generating means and the plasma generating space can be shortened. With a shortened distance between the plasma generating means and the plasma generating space, plasma can be generated efficiently.

The spiral guide passage may be defined in the gap for flowing coolant, and the coolant may be flowed along this guide passage. Accordingly, the side wall of the process chamber can be efficiently and generally uniformly cooled. The guide passage can be easily defined by forming the projection on the shielding plate disposed in the gap.

The radio frequency magnetic field generated in the plasma generating space generates an electromotive force surrounding the radio frequency magnetic field, in a plane perpendicular to the radio frequency magnetic field and in the circumferential direction. Current to be generated by this electromotive force in the shielding plate can be eliminated by forming slits in the shielding plate. Since induced current by the radio frequency magnetic field can be suppressed, plasma can be generated efficiently.

The base may be disposed outside the space where the plasma is generated.

If the base for placing thereon a substrate is disposed externally of the plasma generating space, plasma does not directly contact the surface of the substrate. Accordingly, damages on the substrate to be caused by the plasma can be suppressed.

According to another aspect of the present invention, there is provided a plasma processing method including the steps of: applying a radio frequency magnetic field to an etchant gas through coolant flowing in a tubular passage, and generating inductively coupled plasma; and disposing a workpiece at a position remote from the plasma, and etching the workpiece.

The plasma generating step may preferably include the steps of: starting applying the radio frequency magnetic field under the condition where the coolant does not exist, and generating the plasma; and supplying coolant while continuing to apply the radio frequency magnetic field through the coolant and keeping the plasma.

If plasma is generated under the condition that coolant is not flowed and if thereafter the coolant is flowed, plasma can be generated more stably.

In the above manner, it is possible to generate high density plasma under a low pressure and prevent the inner surface of a vacuum belljar from being etched or sputtered by the plasma. It is therefore possible to prevent the generation of impurities from the vacuum belljar and improve an yield and reliability of semiconductor devices. Since the replacement period of vacuum belljars can be prolonged, a running cost can be reduced.

BRIEF DESCRIPTION OF THE DRAWINGS

FIGS. 3A and 3B are cross sectional views showing examples of a gap portion between the vacuum belljar and an external belljar of the plasma processing system shown in FIG. 1.

DETAILED DESCRIPTION OF THE PREFERRED EMBODIMENTS

A plasma processing system according to an embodiment of the invention will be described with reference to FIG. 1.

Figure 1:
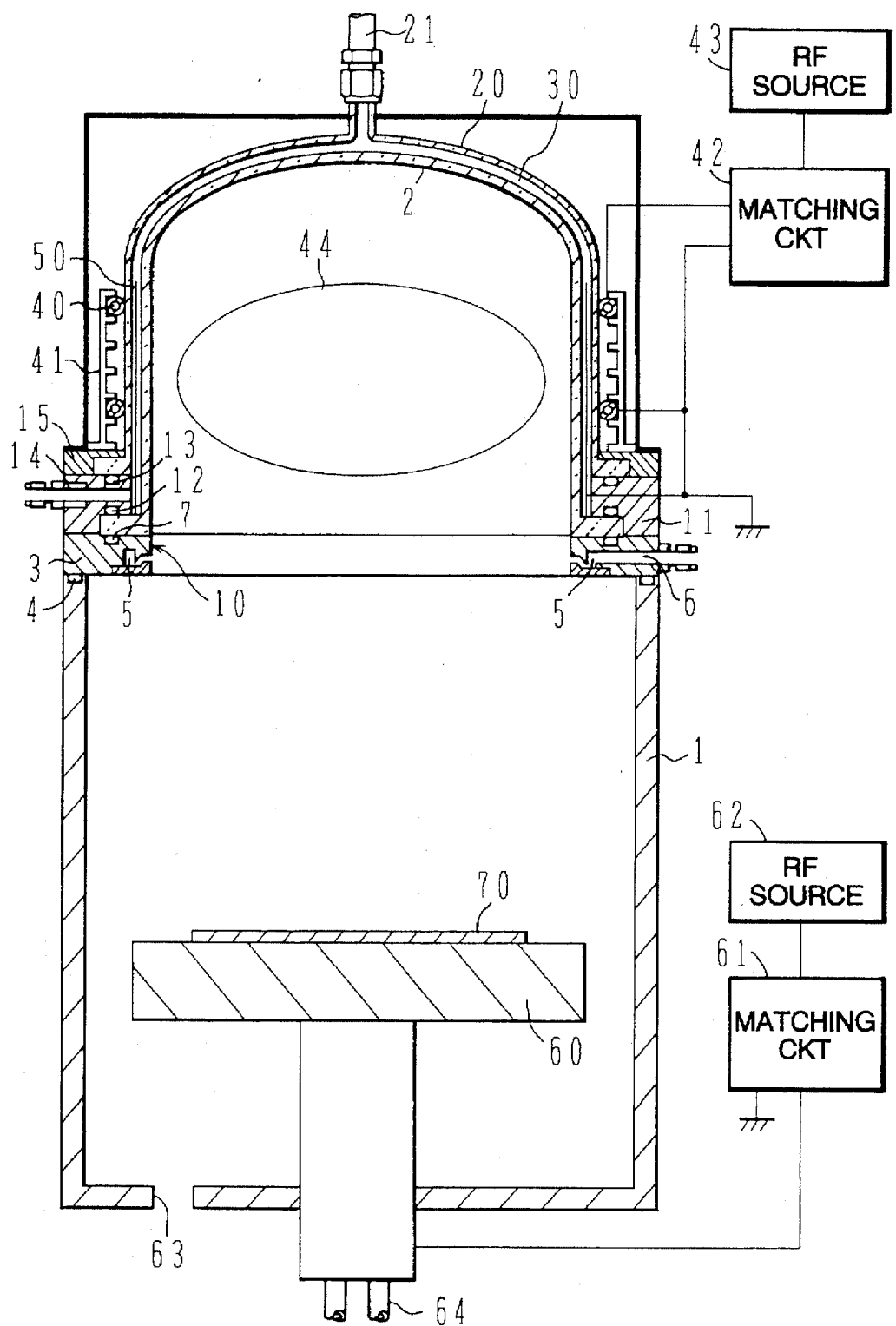
FIG. 1 is a cross sectional view of a plasma processing system according to an embodiment of the invention.

FIG. 1 is a cross sectional view of a plasma processing system according to the embodiment. A hermetically sealed process space is defined by a chamber 1 and a vacuum belljar 2. The chamber 1 has a circular opening 10 at the top thereof. The vacuum belljar 2 has a tubular side wall which seals the opening 10.

The peripheral portion of the opening 10 of the chamber 1 is constituted by a top member 3 formed independently from the side wall of the chamber 1. The top member 3 is hermetically coupled to the side wall by an O-ring 4. A gas passage 5 surrounding the peripheral portion of the opening 10 is formed in the top member 3. The gas passage 5 has an opening formed at the inner circumference of the opening 10 along the circumferential direction, and communicates with the outside of the top member 3 via a process gas inlet pipe 6.

A contact surface between the top member 3 and the vacuum belljar 2 is hermetically sealed by an O-ring 7.

A bottom flange of the vacuum belljar 2 is pushed by an annular member 11 against the upper member 3 to fix the vacuum belljar 2 to the chamber 1. A contact surface between the upper surface of the bottom flange of the vacuum belljar 2 and the annular member 11 is hermetically sealed by another O-ring 12.

An external belljar 20 having a tubular side wall is disposed covering the vacuum belljar 2. A constant gap 30 is defined between the outer surface of the side wall of the vacuum belljar 2 and the inner surface of the side wall of the external belljar 20.

A bottom flange of the external belljar 20 is pushed by an annular member 15 against the lower annular member 11 to fix the external belljar 2 to the lower annular member 11. A contact surface between the lower surface of the bottom flange of the external belljar 20 and the annular member 11 is hermetically sealed by an O-ring 13.

The inner diameter of the annular member 11 is generally the same as that of the external belljar 20. Therefore, the gap 30 is defined between the outer circumferential surface of the vacuum belljar 2 and the inner circumferential surface of the annular member 11 as well as that of the external belljar 20. The term "generally the same" permits minor differences of the diameters, provided that the practical flow of coolant can be established as if the diameters are the same. A coolant supply tube 14 is formed in the annular member 11 to communicate with the gap 30. Coolant can therefore be supplied into the gap 30 via the coolant supply tube 14.

A coolant exhaust pipe 21 is connected to the top of the external belljar 20 to allow coolant in the gap 30 to be exhausted to the outside.

A coil 40 is wound round the outer circumferential surface of the tubular external belljar 20, concentrically therewith. The coil 40 is formed of a conductive pipe capable of flowing cooling water therethrough. The coil 40 is supported at a predetermined position by a support 41 made of insulating material such as Teflon. Radio frequency (RF) current is supplied to the coil 40 from an RF power source 43 through a matching circuit 42. For example, RF current at a frequency of 13.56 MHz is supplied. One end of the coil 40 is grounded.

As RF current is flowed through the coil 40, an RF magnetic field is generated in the space of the vacuum belljar 2 in the vertical direction as viewed in FIG. 1. This RF magnetic field generates an electric field in the space of the vacuum belljar 2 in the circumferential direction. This electric field generates a plasma 44 of an inductive coupling type.

A conductive shield plate 50 is disposed in the gap 30, extending at least from the position slightly lower than the uppermost coil turn to the position slightly higher than the lowermost coil turn. The shielding plate 50 is grounded. The detailed structure of the shielding plate 50 will be described later with reference to FIGS. 2, 3A and 3B.

A base 60 is disposed at the lower position of the chamber 1 to place thereon a workpiece substrate 70. An electrostatic chuck is formed at the upper surface of the base 60 to allow the substrate 70 to be electrostatically attracted to the base 60. The base is made of conductive material, and supplied with an RF voltage of, for example, a frequency of 100 to 200 kHz from another RF power source 62 through a matching circuit 61. A heater or a coolant passage 64 are also disposed in the base 60 to heat or cool the substrate 70.

An exhaust hole 63 is formed in the bottom wall of the chamber 1 to evacuate the process space. The process space can be maintained at a constant pressure by supplying a predetermined amount of process gas from the process gas inlet pipe 6 into the process space and by regulating the exhaust gas flow through the exhaust hole 63.

The size and material of each constituent of the plasma processing system shown in FIG. 1 will be illustratively described assuming that 8-inch wafers are processed.

The vacuum belljar 2 and external belljar 20 are made of, for example, quartz glass. The chamber 1 is made of, for example, aluminum. The shielding plate 50 is made of paramagnetic and conductive material such as Al. The coil 40 is made of a copper tube covered with a Teflon tube, the copper tube having an inner diameter of 4 to 5 mm and an outer diameter of 6 mm.

The tubular side wall of the vacuum belljar 2 has an inner diameter of 254 mm and an outer diameter of 262 mm. The gap 30 is 3 mm wide, and the thickness of the external belljar 20 is 3 min. The height of the vacuum belljar 2 is about 250 mm.

The chamber 1 is of a square pole shape and the outer periphery of its side wall has a square cross section with a side length of 460 mm. The inner periphery thereof has a circle cross section with a diameter of 420 mm. The base 60 is of a disc shape with a diameter of 280 mm.

Next, the structure of the shielding plate 50 will be described with reference to FIGS. 2, 3A and 3B.

Figure 2:
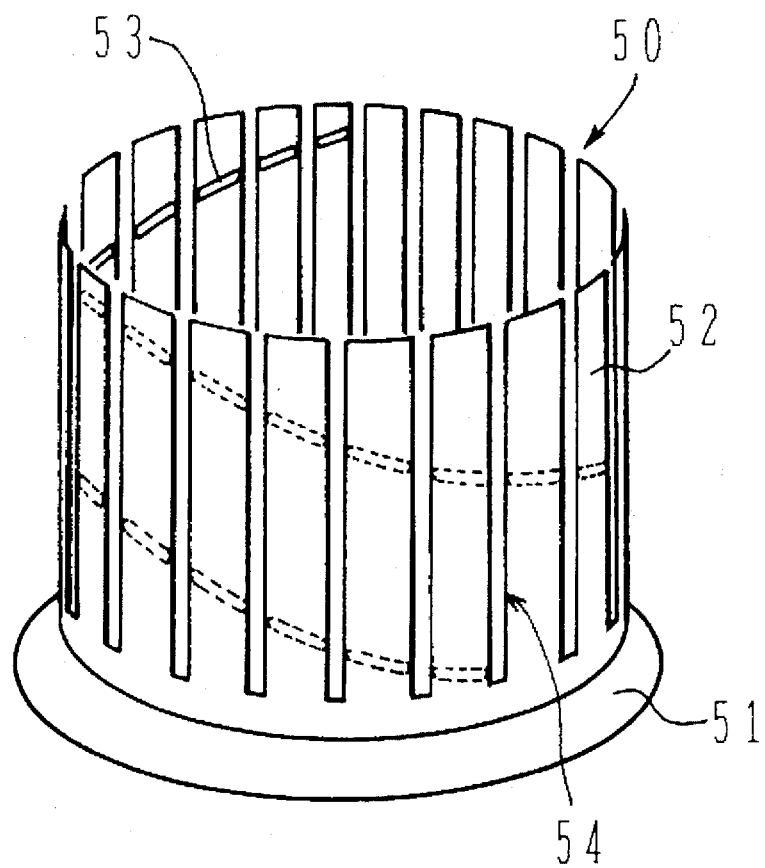
FIG. 2 is a perspective view of a shielding plate of the plasma processing system shown in FIG. 1.
Figure 4:
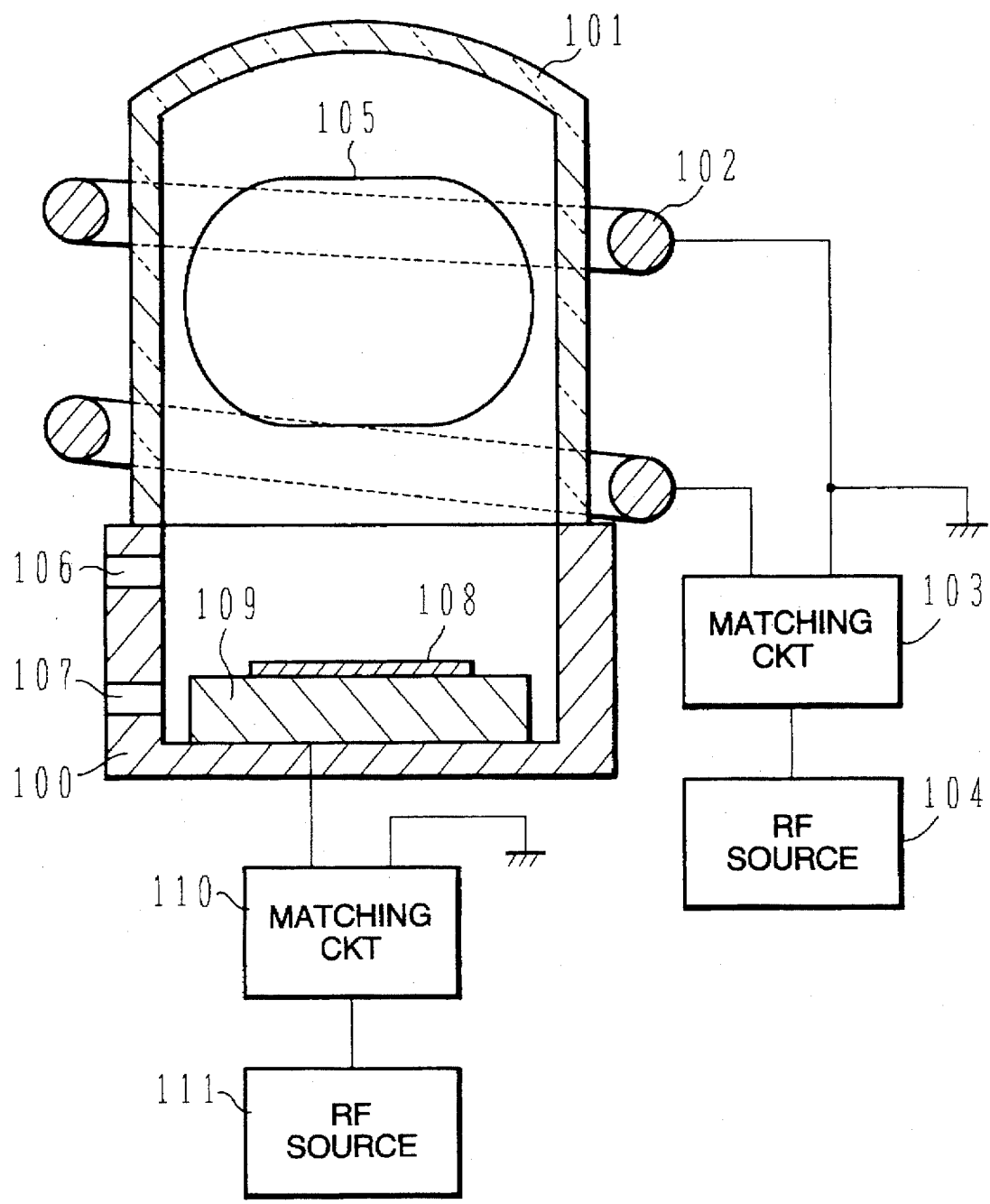
FIG. 4 is a cross sectional view of a conventional plasma processing system.

FIG. 2 is a perspective view of the shielding plate 50. A tubular side wall 52 of the shielding plate 50 has a plurality of slits 54 extending along the axial direction of the plate 50, the side wall 52 being made of conductive material. A flange 51 is formed at the bottom of the side wall 52. A spiral projection 53 is formed on the inner circumferential surface of the side wall 52, extending from the bottom of the side wall 52 to the top thereof spirally.

The slits 54 of the side wall 52 function as a means for preventing current from flowing in the circumferential direction. When an RF magnetic field is generated in the space surrounded by the side wall 52 by the coil 1 shown in FIG. 1, an electromotive force is generated in the circumferential direction. As this electromotive force causes current to flow, a change in the RF magnetic field is cancelled out so that plasma will not be generated. However, the slits 54 of the side wall 52 restrict the current flow in the circumferential direction and allow plasma to be efficiently generated. The pitch of the slits 54 can be determined based on the frequency of the FR field.

FIG. 3A is a partly exaggerated cross sectional view of the gap 30 shown in FIG. 1. The side wall 52 of the shielding plate 50 is disposed in the gap 30 and fixed to the flange of the vacuum belljar 2 by the flange 51. The outer circumferential surface of the side wall 52 is generally in tight contact with the inner circumferential surface of the external belljar 20, and the top of the spiral projection 53 is generally in contact with the outer circumferential surface of the vacuum belljar 2.

A spiral passage is defined in the gap 30 by the projection 53. Therefore, as coolant is supplied from the bottom portion of the gap 30, it flows upward along the spiral passage in the tubular gap 30, generally uniformly cooling the side wall of the vacuum belljar 2.

FIG. 3B shows another structure of the shielding plate 50. In FIGS. 2 and 3A, the projection is formed on the inner surface of the side wall 52, for example by welding or soldering. In FIG. 3B, the projection 53 is formed by partially bending the side wall 52 in a V-character shape, projecting toward the vacuum belljar 2. Other shapes such as a U-character shape may also be used to form the projection 53. Such a side wall can be machined by pressing a cylindrical member.

Next, a method of etching a silicon oxide film by using the plasma processing system shown in FIG. 1 will be described.

A silicon substrate 70 with a silicon oxide film being formed on its surface is placed on the base 60 and fixed thereto by the electrostatic chuck. Although not shown in FIG. 1, the silicon substrate 70 may be transported into the chamber 1 through a load lock chamber.

The inside of the chamber 1 is evacuated for about 10 seconds by a turbo molecule pump. After a predetermined pressure is obtained through evacuation, $CF_4$ and $CHF_3$ gases are introduced from the process gas inlet pipe 6 into the process space. The pressure in the process space is regulated to be about 10 mTorr. The $CF_4$ and $CHF_3$ gases are generally uniformly supplied from the gas passage 5 formed in the top member 3. Coolant such as fluorine containing solvent (e.g. Fluorinert available from 3M, USA) is flowed through a coolant passage 64 in the base 60 to cool the silicon substrate 70 to a temperature of −60° C.

An RF current at a frequency of 13.56 MHz is flowed in the coil 40 to generate an inductive coupling plasma 44 in the inner space of the vacuum belljar 2. A supply power is, for example, about 1 kW. An RF bias voltage at a frequency of 100 kHz is applied to the base 60. A supply power is, for example, 100 to 200 W. The frequency of the RF bias voltage may be set in a range of about 100 kHz to about 20 MHz.

Next, pure water is supplied from the coolant supply pipe 14 into the gap 30. The pure water supplied into the gap 30 flows spirally along the spiral passage defined in the gap 30 and is exhausted to the outside through the upper coolant exhaust pipe 21. Since the pure water flows spirally along the outer circumferential surface of the vacuum belljar 2, the inside of the vacuum belljar 2 is generally uniformly cooled. The exhausted pure water may be reused after it is cooled again. Coolant flowing in the gap 30 is not necessarily pure water. Coolant not absorbing an RF magnetic field is preferable. Since the inside of the vacuum belljar 2 is uniformly cooled, chemical reaction between ions and the like in plasma and the inner surface of the vacuum belljar 2 is suppressed. Therefore, the inner surface of the vacuum belljar 2 can be prevented from being etched.

Furthermore, since the shielding plate 50 is disposed between the coil 40 and vacuum belljar 2, it shields the RF electric field generated by the coil 40. Therefore, the RF electric field cannot reach near the inner surface of the vacuum belljar 2. Since the RF electric field cannot reach near the inner surface of the vacuum belljar 2, electrostatic coupling plasma is not generated, nor ions and the like in inductive coupling plasma are attracted near to the inner surface of the vacuum belljar 2. Pure water has a high electric resistance and can be considered as almost an insulator.

In this manner, it is possible to prevent the inner surface of the vacuum belljar 2 from being sputtered by ions and the like in plasma.

Ions or radicals in the plasma 44 generated in the space of the vacuum belljar 2 are transported to the surface of the silicon substrate 70 and etch the silicon oxide film formed on the surface of the substrate 70.

It can be estimated from other preliminary experiments that an etching rate of the silicon oxide film under the above conditions is about 700 nm/min and an etching ratio of silicon oxide to silicon is about 15. It is also considered that the distribution of etching rates is ±3% or lower irrespective of a pattern size.

Since high density plasma can be generated through inductive coupling even at a low pressure, a relatively high etching rate can be obtained. For example, plasma having an electron density of $10^{11}$ cm$^{-3}$ was able to be generated under the conditions of a pressure of 0.1 Torr and a RF power supply of 1 kW. Furthermore, since etching is performed under a low pressure, the microloading effects can be suppressed.

Since the silicon substrate 70 is placed at a position remote from the space where the plasma 44 is generated, damages on the substrate surface to be caused by plasma can be suppressed.

Since the shielding plate is disposed in the gap through which coolant is flowed, a distance between the plasma generating space and the coil can be shortened. It is therefore possible to efficiently generate plasma.

In the above embodiment, although pure water is used as the coolant, other coolants such as fluorinated solvent (e.g. Fluorinert) may also be used. It is preferable to use non-conductive coolant so that an electromotive force generated by an RF magnetic field does not make current flow in the circumferential direction.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A plasma processing apparatus comprising:

a process chamber having a side wall capable of being evacuated;

magnetic field generating means disposed externally of the side wall of said process chamber, for generating a radio frequency electric field and a radio frequency magnetic field in said process chamber and generating plasma through inductive coupling;

a base disposed in said process chamber for placing thereon a substrate to be processed;

cooling means for cooling the side wall of said process chamber near at a space where the plasma is generated, said cooling means comprising:

a double wall structure cooperating with said side wall serving as an inner wall and having an outer wall for defining a hermetically sealed gap between the inner wall and the outer wall;

coolant supply means for supplying coolant into the gap; and coolant exhaust means for exhausting the coolant from the gap; and a conductive shielding plate disposed in the gap for shielding the radio frequency electric field.

2. A plasma processing apparatus according to claim 1, wherein:

the inner wall and the outer wall of said double wall structure each has a tubular shape portion whose center axis is set generally in the vertical direction, and jointly define a guide passage in the gap defined by the double wall structure, the guide passage spirally transporting the coolant along the tubular shape portion;

said coolant supply means supplies the coolant from a lower portion of a guide passage; and said coolant exhaust means exhausts the coolant from an upper portion of the guide passage.

3. A plasma processing apparatus according to claim 2, wherein:

said shielding plate has a projection formed on the side of the inner wall of said double wall structure, said projection reaching near the outer surface of the inner wall;

the outer surface of the inner wall of said double wall structure and said shielding plate define the horizontal position of said guide passage; and the projection formed on said shielding plate defines the vertical position of said guide passage.

4. A plasma processing apparatus according to claim 2, wherein said shielding plate is formed with a plurality of slits crossing circumferential direction of said side wall.

5. A plasma processing apparatus according to claim 1, wherein said base is disposed outside a space where the plasma is generated.

6. A plasma processing apparatus according to claim 1, wherein said magnetic field generating means comprises:

a coil wound round the outer surface of said process chamber, said coil surrounding a space where the plasma is generated; and a radio frequency power source for supplying a radio frequency current to said coil.

7. A plasma processing apparatus according to claim 6, wherein one end of said coil and said shielding plate are both grounded and applied with a ground potential.

8. A plasma processing apparatus according to claim 7, wherein said base is made of conductive material, and the plasma processing apparatus further comprises another radio frequency power source for applying a radio frequency voltage to said base relative to the ground potential.

9. A plasma processing apparatus comprising:

a support member having a support surface;

a double-walled belljar having an opening and consisting essentially of an inner belljar portion and an external belljar portion coupled along a periphery of the opening to define a gap therebetween for allowing flow of coolant therethrough, the opening of the double-walled belljar disposed on the support surface to define a process space, each of the inner and external belljar portions consisting essentially of a tubular section having a straight axis and a uniform diameter and a converging section having a decreasing diameter and connected to an end of the tubular section at the opposite end to said opening;

magnetic field generating means disposed outside of said tubular section of said external belljar portion for generating a radio frequency magnetic field in said process space to generate plasma through inductive coupling; and a base disposed in said process space for placing thereon a substrate to be processed.

10. A plasma processing apparatus according to claim 9, wherein said support member has an auxiliary space with a coupling aperture, said base disposed in the auxiliary space, and the opening of said doubled-walled belljar sealing the coupling aperture.

11. A plasma processing apparatus according to claim 9, further comprising a conductive shield member disposed in said gap such that said magnetic field generating means is disposed outside the conductive shield member.

12. A plasma processing apparatus according to claim 11, wherein said conductive shield member is disposed only in said tubular section.

13. A plasma processing apparatus according to claim 11, wherein said magnetic field generating means comprises a coil wound around the tubular section of said external belljar portion, and said conductive shield member has slits directed parallel to the axial direction.

14. A plasma processing apparatus according to claim 9, further comprising guiding means for guiding flow of coolant in said gap.

15. A plasma processing apparatus according to claim 14, wherein said guiding means comprises a cylindrical conductive plate with slits and projections.

16. A plasma processing apparatus according to claim 15, wherein said magnetic field generating means comprises a coil wound around the tubular section of said external belljar portion, and said slits are elongated parallel to the axial direction.

17. A plasma processing apparatus according to claim 16, wherein said projections are arranged to form a spiral passage.

18. A plasma processing apparatus according to claim 16, wherein said cylindrical conductive plate is made of paramagnetic material, and said inner and external belljar portions are made of insulating material.

* * * * *